United States Patent
Behera et al.

(10) Patent No.: US 8,963,613 B2
(45) Date of Patent: Feb. 24, 2015

(54) CANCELING THIRD ORDER NON-LINEARITY IN CURRENT MIRROR-BASED CIRCUITS

(75) Inventors: Manas Behera, Cedar City, TX (US); Yanping Ding, San Diego, CA (US); Junxiong Deng, Grandville, MI (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 13/551,355

(22) Filed: Jul. 17, 2012

(65) Prior Publication Data
US 2013/0038384 A1 Feb. 14, 2013

Related U.S. Application Data

(60) Provisional application No. 61/522,553, filed on Aug. 11, 2011.

(51) Int. Cl.
*H03F 3/347* (2006.01)
*H03F 1/32* (2006.01)
*G05F 3/26* (2006.01)

(52) U.S. Cl.
CPC .............. *G05F 3/262* (2013.01); *H03F 1/3205* (2013.01); *H03F 3/347* (2013.01); *H03F 2200/91* (2013.01)
USPC ........... 327/403; 327/404; 327/407; 327/408; 327/108; 330/277

(58) Field of Classification Search
CPC ... H03F 1/3205; H03F 2200/91; H03F 3/347; G05F 3/262
USPC ......... 327/538, 540, 541, 542, 543, 545, 546, 327/549, 551, 552, 553, 556, 558, 560, 592, 327/403, 404, 407, 408, 108, 362; 330/254, 330/277, 278, 285

See application file for complete search history.

(56) References Cited

U.S. PATENT DOCUMENTS 5,113,129 A 5/1992 Hughes
6,894,556 B2 5/2005 Kawasumi
(Continued)

FOREIGN PATENT DOCUMENTS

EP 0606123 A1 7/1994

OTHER PUBLICATIONS

Aparin V., et al., "Modified Derivative Superposition Method for Linearizing FET Low-Noise Amplifiers", IEEE Transactions on Microwave Theory and Techniques, IEEE Service Center, Piscataway, NJ, US, vol. 53, No. 2, Feb. 1, 2005, pp. 571-581, XP011126918 ISSN: 0018-9480.

(Continued)

*Primary Examiner* — Lincoln Donovan
*Assistant Examiner* — Jung H Kim (57) ABSTRACT

A current mirror circuit is described. The current mirror circuit includes a first transistor and a second transistor. The gates of the first transistor and the second transistor are coupled at a bias voltage. The current mirror circuit also includes an auxiliary transistor that is biased into weak inversion by receiving the bias voltage at a gate of the auxiliary transistor after being reduced by an offset voltage. The sources of the first transistor, second transistor and auxiliary transistor are coupled together. A primary current from the drain of the second transistor is combined with an auxiliary current from the drain of the auxiliary transistor to produce an output current.

10 Claims, 9 Drawing Sheets

(56) References Cited

U.S. PATENT DOCUMENTS

| | | | |
|---|---|---|---|
| 7,463,013 B2 | 12/2008 | Plojhar | |
| 2005/0176399 A1* | 8/2005 | Aparin | 455/341 |
| 2008/0204142 A1* | 8/2008 | Kang | 330/281 |
| 2009/0174481 A1* | 7/2009 | Chang | 330/277 |
| 2009/0195310 A1* | 8/2009 | Holenstein et al. | 330/254 |
| 2009/0261905 A1 | 10/2009 | Ishiguro | |
| 2011/0018635 A1* | 1/2011 | Tasic et al. | 330/277 |
| 2011/0095745 A1 | 4/2011 | Noda | |
| 2012/0025801 A1 | 2/2012 | Hirose et al. | |
| 2012/0306576 A1* | 12/2012 | Paidi et al. | 330/277 |

OTHER PUBLICATIONS

International Search Report and Written Opinion—PCT/US2012/050471—ISA/EPO—Jul. 3, 2013.

* cited by examiner

CANCELING THIRD ORDER NON-LINEARITY IN CURRENT MIRROR-BASED CIRCUITS

CLAIM OF PRIORITY UNDER 35 U.S.C. §119

The present application for patent claims priority to Provisional Application No. 61/522,553, entitled "Novel 3rd order non-linearity cancellation technique for current-mirror based circuits", filed Aug. 11, 2011, and assigned to the assignee hereof and hereby expressly incorporated by reference herein.

TECHNICAL FIELD

The present disclosure relates generally to electronic devices. More specifically, the present disclosure relates to current mirror-based circuits.

BACKGROUND

The use of electronic devices has greatly increased in recent years. For example, people often use cellular phones, smart phones, computers, music players, televisions and gaming systems, among other electronic devices. The use of electronic devices has become so prevalent that these devices are practically ubiquitous in modern society. The decreasing cost of electronic components has particularly encouraged the widespread use of electronic devices.

Electronic devices are often designed and implemented in a modular fashion. For example, an electronic device may include multiple electronic modules or blocks implemented using electronic components and/or integrated circuitry. These modules or blocks typically provide certain functionality used in the operation of the electronic device.

Integrated circuits may provide differing functions for an electronic device. In particular, some integrated circuits are used for processing digital and/or analog signals. For example, one integrated circuit or a component of an integrated circuit may produce or filter a current. As can be seen from this discussion, systems and methods that cancel third order non-linearity in current mirror-based circuits may be beneficial.

SUMMARY

A current mirror circuit is disclosed. The current mirror circuit includes a first transistor and a second transistor. The gates of the first transistor and the second transistor are coupled at a bias voltage. The current mirror circuit also includes an auxiliary transistor that is biased into weak inversion by receiving the bias voltage at a gate of the auxiliary transistor after being reduced by an offset voltage. The sources of the first transistor, second transistor and auxiliary transistor are coupled together. A primary current from the drain of the second transistor is combined with an auxiliary current from the drain of the auxiliary transistor to produce an output current.

A third harmonic component of the primary current may be approximately 180 degrees out of phase with a third harmonic component of the auxiliary current. A baseband component of the primary current may be in phase with a baseband component of the auxiliary current.

In one configuration, the current mirror circuit may also include a voltage offset circuit that reduces the bias voltage by the offset voltage. The voltage offset circuit may include a first operational amplifier with a gain of approximately two, wherein the second transistor has a gate length approximately double a gate length of the auxiliary transistor. The output of the voltage offset circuit may be phase shifted by a second operational amplifier biased with a variable capacitor. The output of the second operational amplifier may be directed to the gate of the auxiliary transistor.

The gates of the auxiliary transistor and the second transistor may be coupled together and the auxiliary transistor may be included or excluded from the current mirror using a switch. The current mirror circuit may be in a baseband filter of a wireless transmitter that receives an analog transmit signal from a digital-to-analog converter and sends the output current to a mixer.

A method for canceling third harmonic components in current mirror-based circuits is also disclosed. An input signal is received. A primary current is produced using a current mirror based on the received input signal. The current mirror includes a first transistor and a second transistor. A bias voltage received from gates of the first and second transistor is adjusted. An auxiliary transistor is biased using the adjusted bias voltage to produce an auxiliary current. The primary current and the auxiliary current are combined to produce an output current.

An apparatus for canceling third harmonic components in current mirror-based circuits is also disclosed. The apparatus includes a means for receiving an input signal. The apparatus also includes means for producing a primary current using a first transistor and a second transistor. The apparatus also includes means for adjusting a bias voltage received from gates of the first transistor and second transistor. The apparatus also includes means for biasing an auxiliary transistor using the adjusted bias voltage to produce an auxiliary current. The apparatus also includes means for combining the primary current and the auxiliary current to produce an output current.

DETAILED DESCRIPTION

Wireless transmitters may be used to send data through a wireless channel. In one example, it may be desirable for Long Term Evolution (LTE) transmitters to comply with 4FMOD guidelines. Performance of a transmitter may depend on at least two parameters, third order non-linearity of a baseband filter and local oscillator harmonic rejection. In one configuration, the present systems and methods may improve the linearity of the transmit baseband filter by 15 dB, e.g., in LTE mode. Specifically, the present systems and methods may use derivative superposition in a direct current (DC) coupled configuration to cancel the third order non-linearity of a current mirror-based circuit, e.g., a baseband filter. Furthermore, while the circuits illustrated herein are illustrated as single end circuits, they may alternatively be differential in implementation.

Figure 1:
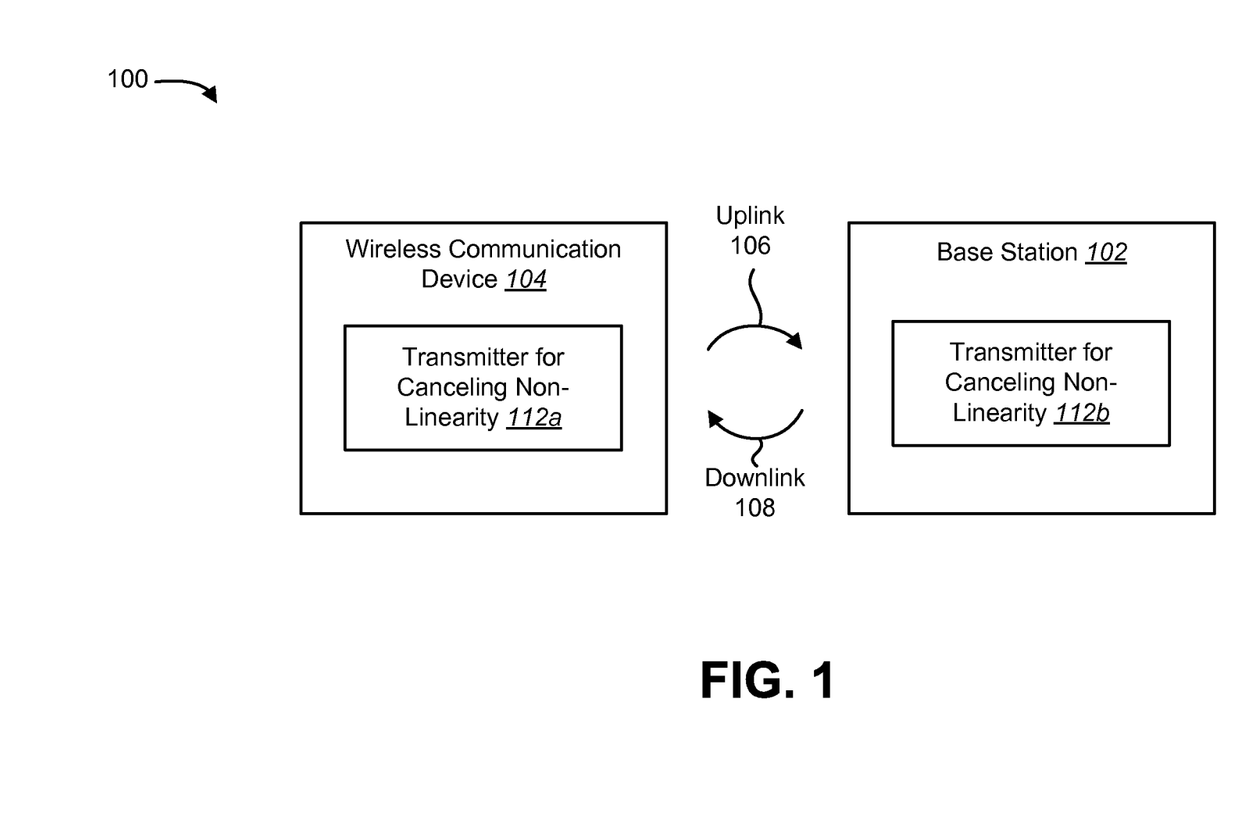
FIG. 1 is a block diagram illustrating a wireless communication system.

FIG. 1 is a block diagram illustrating a wireless communication system 100. A base station 102 may communicate with one or more wireless communication devices 104. The base station 102 may also be referred to as, and may include some or all of the functionality of, an access point, a broadcast transmitter, a Node B, an evolved Node B, etc. Each base station 102 may provide communication coverage for a particular geographic area.

A wireless communication device 104 may be referred to as, and may include some or all of the functionality of, a terminal, an access terminal, a user equipment (UE), a mobile device, a subscriber unit, a station, etc. The wireless communication device 104 may be a cellular phone, a personal digital assistant (PDA), a wireless device, a wireless modem, a handheld device, a laptop computer, etc. The wireless communication device 104 may communicate with zero, one or multiple base stations 102 on the downlink (DL) 108 and/or uplink (UL) 106 at any given moment using one or more antennae. The downlink 108 (or forward link) refers to the communication link from a base station 102 to the wireless communication device 104, and the uplink 106 (or reverse link) refers to the communication link from the wireless communication device 104 to the base station 102.

Electronic devices may use transmitters 112a-b to wirelessly transmit data. One potential problem with wireless transmitters 112a-b is non-linearity. Specifically, some modules in a transmit chain may rely on current mirrors, which may have non-linearity, e.g., third order non-linearity. The introduction of such non-linearity may degrade performance of a wireless device.

The present systems and methods may use the derivative superposition principle in a direct current (DC) coupled configuration to cancel the third order non-linearity. Specifically, a transmitter for canceling non-linearity 112a-b may include a current mirror and an auxiliary transistor in parallel with one of the current mirror primary transistors. By biasing the auxiliary transistor into weak inversion, the third harmonic component of the auxiliary current (from the auxiliary transistor) may be out of phase with the third harmonic component of the current mirror output. Thus, combining the auxiliary transistor output and the primary transistor output may cancel the third harmonic component in the output of the current mirror.

The wireless communication system 100 may be multiple-access systems capable of supporting communication with multiple users by sharing the available system resources (e.g., bandwidth and transmit power). Examples of such multiple-access systems include code division multiple access (CDMA) systems, time division multiple access (TDMA) systems, frequency division multiple access (FDMA) systems, orthogonal frequency division multiple access (OFDMA) systems and spatial division multiple access (SDMA) systems.

Figure 2:
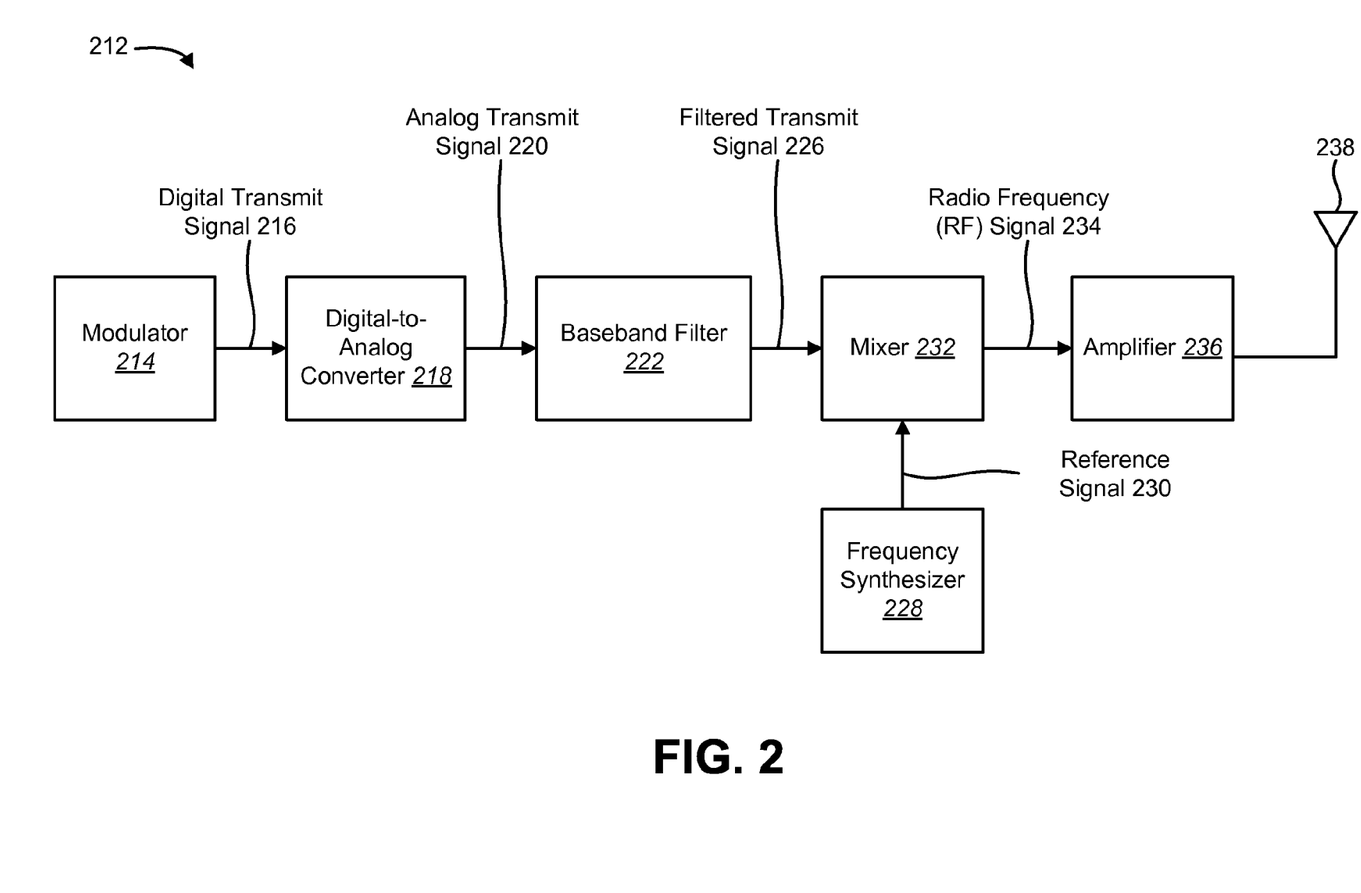
FIG. 2 is a block diagram illustrating a transmitter for canceling non-linearity.

FIG. 2 is a block diagram illustrating a transmitter 212 for canceling non-linearity. The transmitter 212 may reside in a base station 102 or a wireless communication device 104 illustrated in FIG. 1. A transmission signal stream may be created (e.g., by an encoder (not shown)) and sent to a modulator 214 to modulate the signal in order to prepare the signal stream for conveying a message, i.e., to produce a digital transmit signal 216. A digital-to-analog convertor (DAC) 218 may convert the digital transmit signal 216 to an analog transmit signal 220.

A baseband filter 222 may use a current mirror plus one or more RC (resistor-capacitor) poles to filter out undesired high frequency images. Specifically, the baseband filter 222 may use a primary current mirror and an auxiliary transistor biased into weak inversion to cancel third order non-linearity from the primary transistors in the current mirror, as discussed below.

The present systems and methods may be described and illustrated in the context of a baseband filter 222 in a transmitter 212 (e.g., in Long Term Evolution (LTE) mode), but may also be used in other current mirror-based circuits. For example, the non-linearity cancelation techniques described herein may be used to improve linearity of current mirrors in current-mode filters, current buffers, digital-to-analog converters (DACs) 218, etc. Alternatively, or in addition to, the present systems and methods may be used for analog pre-distortion. For example, the transmit baseband filter 222 output may be pre-distorted to cancel non-linearity components in the amplifier 236. In such a configuration, both magnitude and phase of the third order harmonic component in the baseband filter 222 may be tuned independently, e.g., using a phase shifter.

A mixer 232 may convert a filtered transmit signal 226 from the baseband filter 222 into a radio frequency (RF) signal 234 using a reference signal 230 from a frequency synthesizer 228. An amplifier 236 may maintain a desired output signal level by controlling the gain of the signal stream. Finally, the signal stream may be wirelessly transmitted by an antenna 238.

Figure 3:
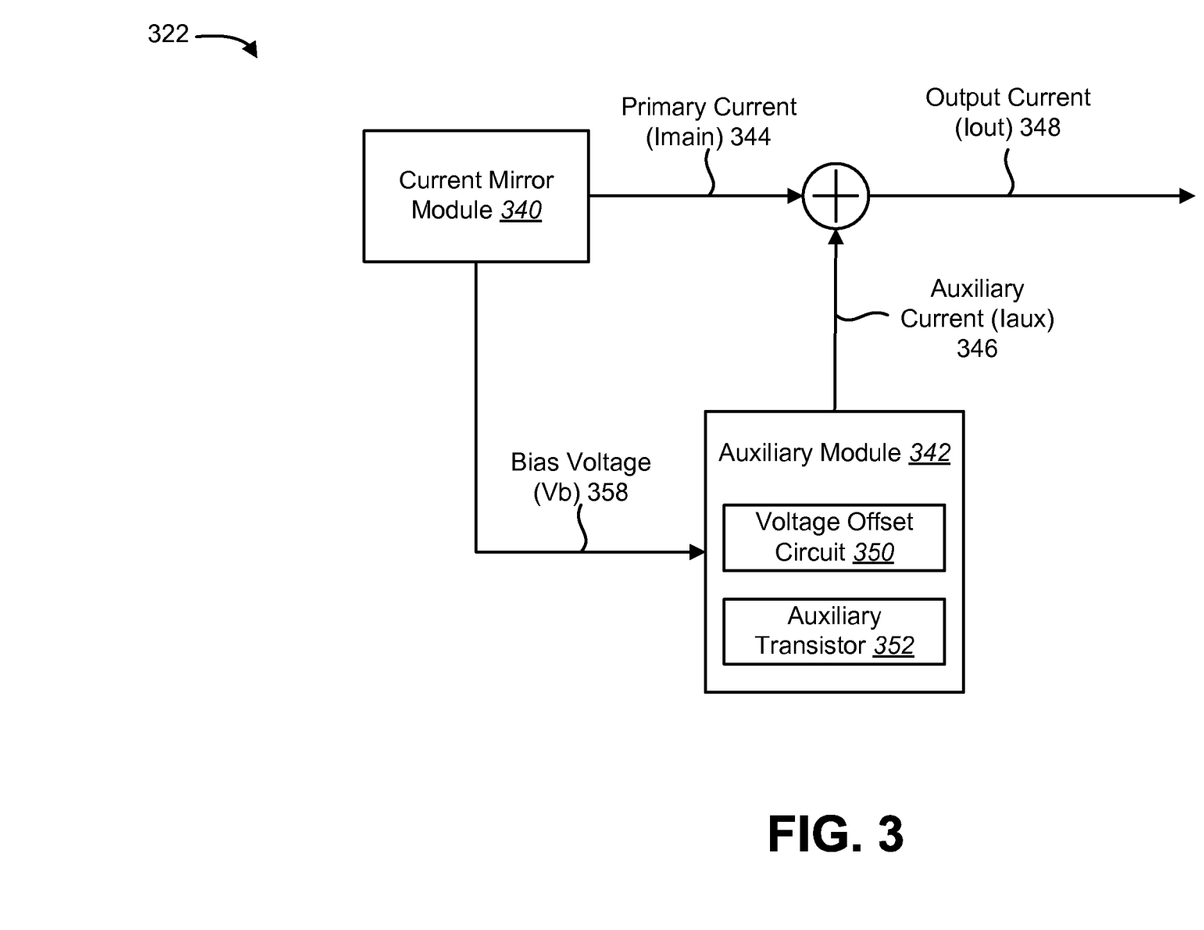
FIG. 3 is block diagram illustrating a baseband filter for canceling third order non-linearity.

FIG. 3 is block diagram illustrating a baseband filter 322 for canceling third order non-linearity. Although described using a baseband filter 322, the present systems and methods may also be applied to any current mirror-based circuit, e.g., current buffers, digital-to-analog converters, etc. The baseband filter 322 may produce an output current (Iout) 348 using a current mirror module 340 and an auxiliary module 342. The current mirror module 340 may produce a primary current (Imain) 344 that is summed with an auxiliary current (Iaux) 346 from the auxiliary module 342 to produce an output current (Iout) 348.

To produce the auxiliary current (Iaux) 346, the auxiliary module 342 may use a voltage offset circuit 350 and an auxiliary transistor 352 (e.g., metal-oxide-semiconductor field effect transistor (MOSFET)). The voltage offset circuit 350 may receive a bias voltage (Vb) 358 from the current mirror module 340 and adjust it before using it to bias the auxiliary transistor 352 into weak inversion. When a metal oxide semiconductor device, such as the auxiliary transistor 352, is changed from strong inversion to weak inversion, the third harmonic component of the output current (e.g., the auxiliary current (Iaux) 346) may make an approximately 180 degree phase transition. Therefore, when the voltage offset circuit 350 biases the auxiliary transistor 352 into weak inversion, the third harmonic component of the auxiliary current (Iaux) 346 may be out of phase with the third harmonic component of the primary current (Imain) 344. Therefore, the output current (Iout) 348 may have a reduced (or zero power) third harmonic component compared to the primary current (Imain) 344. As used herein, a transistor biased into weak inversion means a transistor biased in the sub-threshold region, e.g., the majority carriers at the silicon surface may be repelled away. In other words, the density of minority carriers may be increased with respect to the bulk, but it is still negligible in the overall charge balance. However, these minority carriers may be mobile charges that may produce leakage current as the voltage from drain to source (i.e., Vds) is applied.

Figure 4:
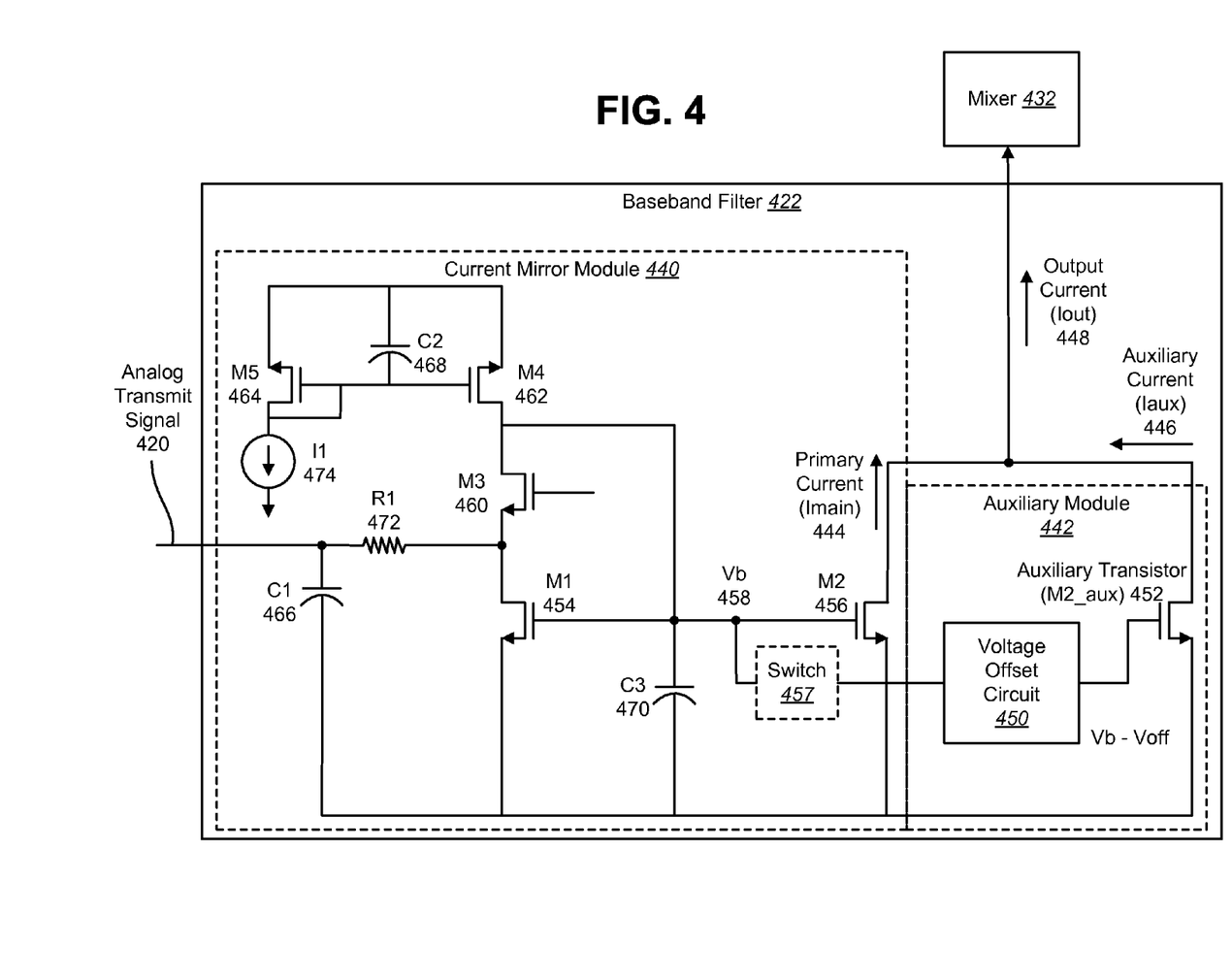
FIG. 4 is a circuit diagram illustrating a baseband filter for canceling third order non-linearity that includes a current mirror module and an auxiliary module.

FIG. 4 is a circuit diagram illustrating a baseband filter 422 for canceling third order non-linearity that includes a current mirror module 440 and an auxiliary module 442. The baseband filter 422 may receive an analog transmit signal 420. The baseband filter 422 may produce an output current (Iout) 448 to be sent to a mixer 432 using a current mirror module 440 and an auxiliary module 442. Although described using a baseband filter 422, the present systems and methods may also be applied to any current mirror-based circuit, e.g., current buffers, digital-to-analog converters (DACs), etc. The current mirror module 440 may include two primary MOS-FETs, M1 454 and M2 456, which constitute a current mirror. While shown here as N-channel MOSFETs, the primary transistors M1 454 and M2 456 may also be implemented with P-channel MOSFETs or any other suitable MOSFET configuration. M2 456 may be configured to mirror the current running through M1 454 to produce the primary current (Imain) 444. Specifically, M1 454 may be biased using a combination of circuit elements, i.e., M4 462 and M5 464 may provide bias current to primary transistors M1 454 and M2 456. Other circuit elements may be included in the current mirror module 440, e.g., M3 460, C1 466, C2 468, C3 470, R1 472 and I1 474. It should be noted that any suitable configuration of biasing circuitry for the primary transistors, M1 454 and M2 456, may be used.

The primary current (Imain) 444 may be output from M2 456. The primary current (Imain) 444 may have a fundamental baseband component (fbb) and a third order harmonic distortion (HD3) component (3fbb). Therefore, if the primary current (Imain) 444 were output from the baseband filter 422 without modification, the transmitter 212 may not operate linearly due to the third harmonic component.

To adjust for this non-linearity, an auxiliary transistor (M2_aux) 452 may be biased in weak inversion. This may include using a voltage offset circuit 450. Specifically, the voltage offset circuit 450 may reduce the bias voltage (Vb) 458 by Voff so that the gate voltage of M2_aux=Vb−Voff. When biased in weak inversion, the auxiliary transistor (M2_aux) 452 may generate an auxiliary current (Iaux) 446 that includes a 3fbb component that is out-of-phase with the 3fbb component in the primary current (Imain) 444. Therefore, the output current (Iout) 448, which is the summation of primary current (Imain) 444 and the auxiliary current (Iaux) 446, may not have a 3fbb component. Optionally, the bias voltage (Vb) 458 may be switched to allow the auxiliary module to be included or excluded based on functionality of a switch 457. In other words, the auxiliary module 442 may be turned off (e.g., via control signal to the switch 457) without impact on original performance of the baseband filter 422.

Figure 5:
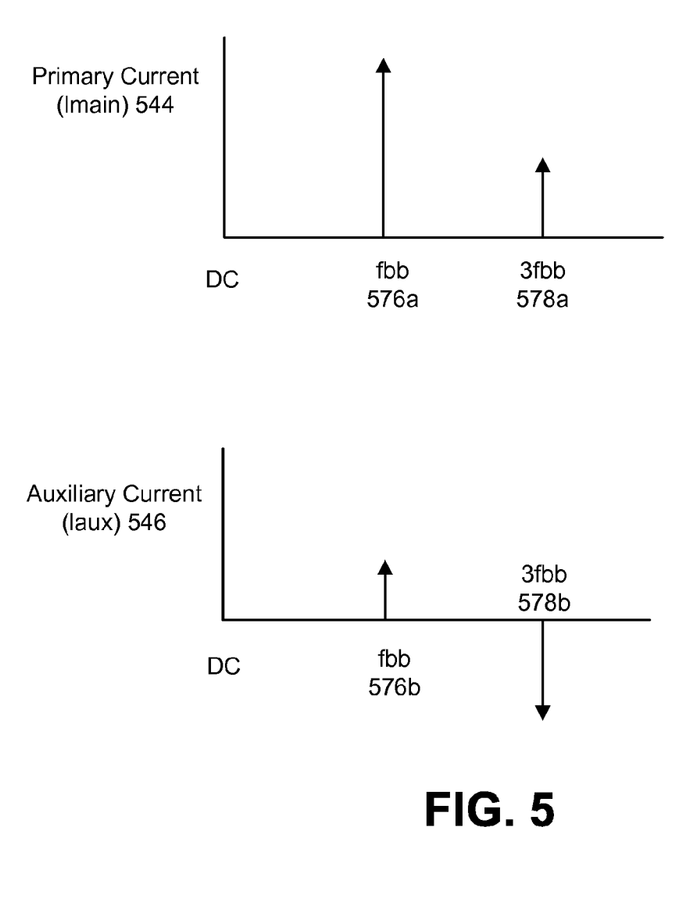
FIG. 5 is a set of graphs illustrating the power of harmonic components in the primary current (Imain) and the auxiliary current (Iaux)

FIG. 5 is a set of graphs illustrating the power of harmonic components in the primary current (Imain) 544 and the auxiliary current (Iaux) 546. Specifically, the power of each current is illustrated as a function of the fundamental component (fbb) 576a-b and an HD3 component (3fbb) 578a-b. As illustrated, both the primary current (Imain) 544 and the auxiliary current (Iaux) 546 may have power at the fundamental component (fbb) 576a-b, where the fundamental component (fbb) 576a-b of the auxiliary current (Iaux) 546 may be smaller than that of the primary current (Imain) 544, e.g., less than half. However, as described above, the 3fbb component 578b of the auxiliary current (Iaux) 546 may be out of phase with 3fbb component 578a of the primary current (Imain) 544. Accordingly, the 3fbb components 578a-b may cancel each other when the primary current (Imain) 544 and the auxiliary current (Iaux) 546 are combined.

Figure 6:
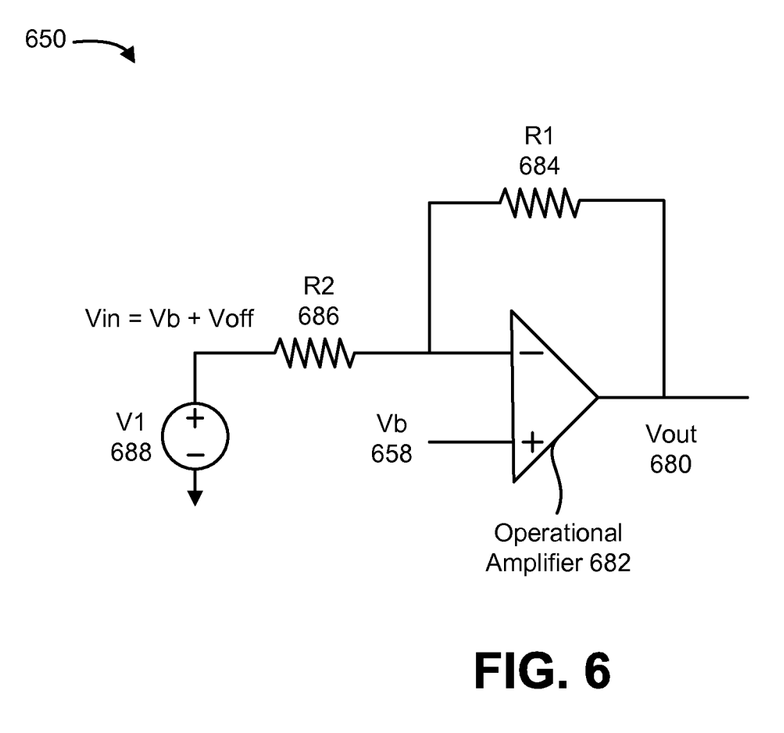
FIG. 6 is a circuit diagram illustrating a voltage offset circuit.

FIG. 6 is a circuit diagram illustrating a voltage offset circuit 650. For example, the voltage offset circuit 650 may be included in the auxiliary modules 342, 442 illustrated in FIGS. 3 and 4, respectively. The voltage offset circuit 650 may receive a bias voltage (Vb) 658 from a current mirror module 440, by setting the Vin=Vb+Voff, it may generate the bias Vb−Voff for the auxiliary transistor (M2_aux) 452 without attenuating the signal amplitude.

To reduce the bias voltage (Vb) 658 by the offset voltage (Voff), the voltage offset circuit 650 may use a single operational amplifier 682, e.g., using negative feedback. The negative input to the operational amplifier 682 may be may be Vin=Vb+Voff, generated by a voltage source (V1) 688. Therefore, the inputs to the voltage offset circuit 650 may be the bias voltage (Vb) 658 and the feedback output voltage (Vout) 680 (i.e., Vb−Voff). The positive input to the operational amplifier 682 may be the bias voltage (Vb) 658. The bias voltage (Vb) 658 may be taken from the gates of the primary current mirror transistors, M1 454 and M2 456.

Additionally, two resistors, R1 684 and R2 686 may determine a gain of the offset module 650. Specifically, the voltage gain (G) may be determined by G=1+R1/R2. In one configuration, R1=R2, and thus, G=2. Alternatively, different configurations may use different ratios of R1/R2, thus providing different gain values. In a configuration where the voltage offset circuit 650 has a gain (G) of 2, the primary transistor M2 456, which generates the primary current (Imain) 444, may have a dimension that is twice as large as the auxiliary transistor (M2_aux) 452, which generates the auxiliary current (Iaux) 446. For example, for a gain (G) of 2 in the voltage offset circuit 650, the primary transistor M2 456 may have a gate length of 2X while the auxiliary transistor (M2_aux) 452 may have a gate length of 1X. In this way, the auxiliary transistor contributes less fundamental component (fbb).

Figure 7:
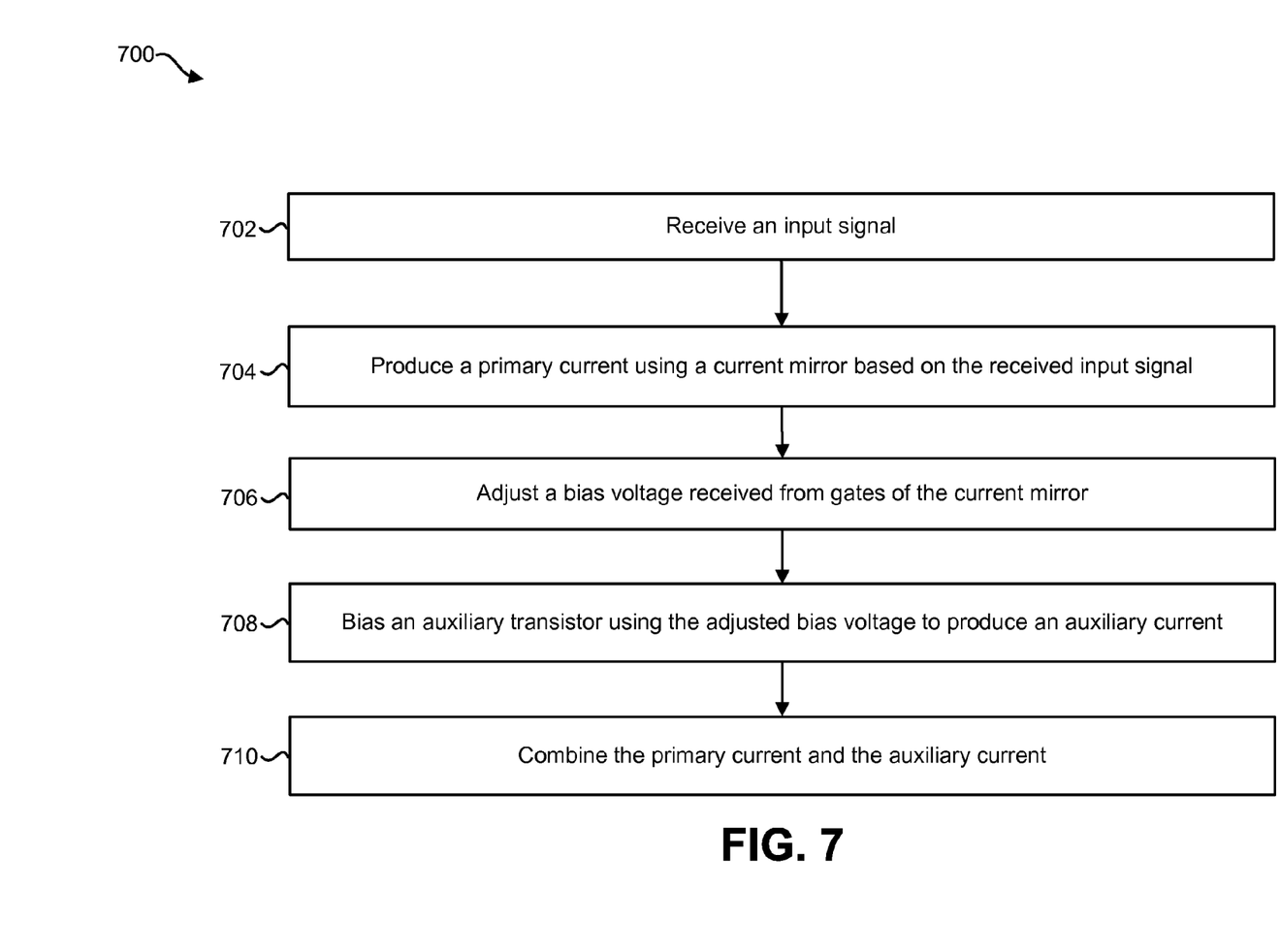
FIG. 7 is a flow diagram illustrating a method for canceling third harmonic components in current mirror-based circuits.

FIG. 7 is a flow diagram illustrating a method 700 for canceling third harmonic components in current mirror-based circuits. The method 700 may be performed by current mirror-based circuit. For purposes of illustration, the method 700 is described as being performed by a baseband filter 422, however, the method 700 may also be performed by a current buffer, a digital-to-analog converter (DAC) or any current mirror-based circuit.

The current mirror-based circuit may receive 702 an input signal. For example, a baseband filter 222 may receive an analog transmit signal 420, e.g., from a DAC. The current mirror-based circuit may also produce 704 a primary current (Imain) 444 using a current mirror based on the received input signal. The primary current (Imain) 444 may include third order non-linearity, which may degrade system performance. Therefore, an auxiliary transistor (M2_aux) 452 may be used to cancel the third order non-linearity. Specifically, the current mirror-based circuit may adjust 706 a bias voltage (Vb) 458 received from the gates of the current mirror. The adjusting 706 may include offsetting the bias voltage (Vb) 458 by an offset voltage (Voff). The current mirror-based circuit may also bias 708 the auxiliary transistor (M2_aux) 452 using the adjusted bias voltage to produce an auxiliary current (Iaux) 446. The auxiliary current (Iaux) 446 may include a third harmonic component that is 180 degrees out of phase with the third harmonic component of the primary current (Imain) 444. The current mirror-based circuit may also combine 710 the primary current (Imain) 444 and the auxiliary current (Iaux) 446, thus producing an output current (Iout) 448 with a reduced or zero third harmonic component. The combining 710 may include coupling the primary current (Imain) 444 and the auxiliary current (faux) 446 to the same node.

Figure 8:
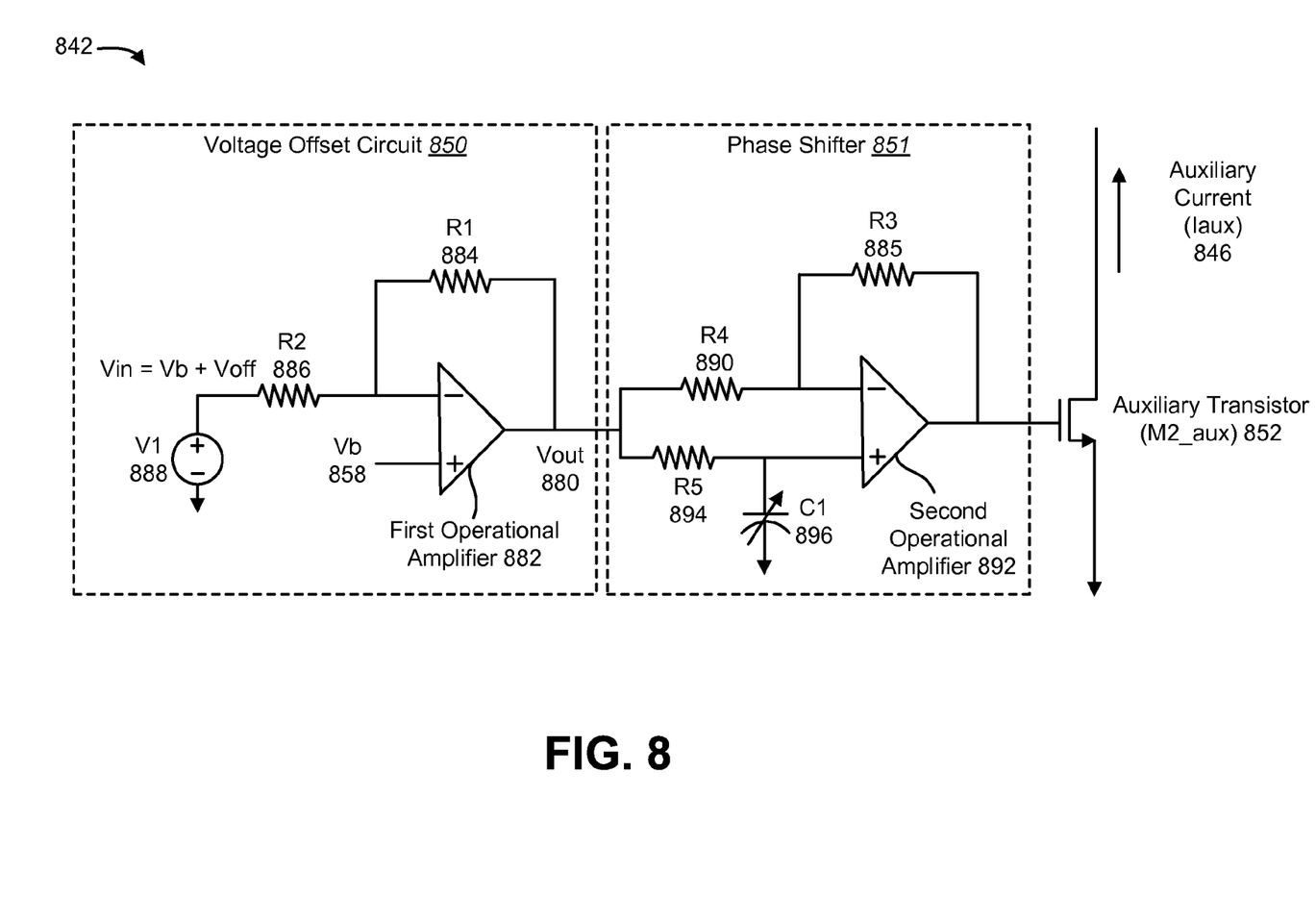
FIG. 8 is a circuit diagram illustrating an alternative configuration of an auxiliary module.

FIG. 8 is a circuit diagram illustrating an alternative configuration of an auxiliary module 842. The auxiliary module 842 illustrated in FIG. 8 may be used for pre-distortion applications, which targets at not only the HD3 cancelation, but generating a well-controlled (both magnitude and phase) HD3 tune to cancel out the nonlinearity (4Fmod) of other transmitter blocks, e.g., the mixer and amplifier. Specifically, the auxiliary module 842 may include a voltage offset circuit 850 and a phase shifter 851, which may allow independent control of the magnitude and phase of pre-distorted auxiliary current (faux) 846. In other words, the auxiliary module 842 illustrated in FIG. 8 may tune the magnitude and phase of the auxiliary current (Iaux) 846 independently instead of using the offset voltage (Voff) for both.

The voltage offset circuit 850 illustrated in FIG. 8 may include the same elements and functionality of the voltage offset circuit 650 illustrated in FIG. 6. Specifically, the voltage source (Vl) 888, R1 884, R2 886, bias voltage (Vb) 858 and first operational amplifier 882 illustrated in FIG. 8 may correspond to the voltage source (Vl) 688, R1 684, R2 686, bias voltage (Vb) 658 and operational amplifier 682 illustrated in FIG. 6.

However, rather than feeding the output (Vout) 880 of the voltage offset circuit 850 to the auxiliary transistor (M2_aux) 852, an all-pass filter may be used as a phase shifter 851. The phase shifter 851 may include a second operational amplifier 892, three resistors (R3 885, R4 890 and R5 894) and a variable capacitor (C1) 896. By tuning the R5C1 product, a phase shift between 30 degrees to 150 degrees may be achieved. The values for R3 885 and R4 890 may be any suitable value. The output of the second operational amplifier 892 may be sent to the gate of the auxiliary transistor (M2_aux) 852 to produce the auxiliary current (Iaux) 846.

Figure 9:
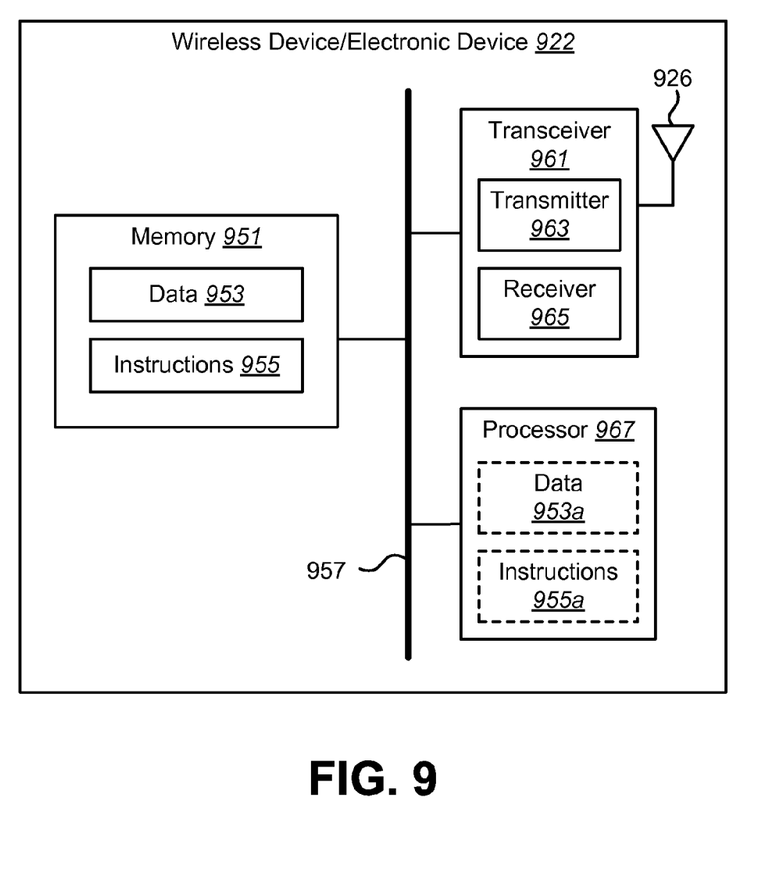
FIG. 9 illustrates certain components that may be included within a wireless device/electronic device.

FIG. 9 illustrates certain components that may be included within a wireless device/electronic device 922. The wireless device/electronic device 922 may be a wireless communication device 104 or a base station 102 as illustrated in FIG. 1.

The wireless device/electronic device 922 includes a processor 967. The processor 967 may be a general purpose single- or multi-chip microprocessor (e.g., an ARM), a special purpose microprocessor (e.g., a digital signal processor (DSP)), a microcontroller, a programmable gate array, etc. The processor 967 may be referred to as a central processing unit (CPU). Although just a single processor 967 is shown in the wireless device/electronic device 922 of FIG. 9, in an alternative configuration, a combination of processors (e.g., an ARM and DSP) could be used.

The wireless device/electronic device 922 also includes memory 951 in electronic communication with the processor 967 (i.e., the processor 967 can read information from and/or write information to the memory 951). The memory 951 may be any electronic component capable of storing electronic information. The memory 951 may be random access memory (RAM), read-only memory (ROM), magnetic disk storage media, optical storage media, flash memory devices in RAM, on-board memory included with the processor, programmable read-only memory (PROM), erasable programmable read-only memory (EPROM), electrically erasable PROM (EEPROM), registers, and so forth, including combinations thereof.

Data 953 and instructions 955 may be stored in the memory 951. The instructions 955 may include one or more programs, routines, sub-routines, functions, procedures, etc. The instructions 955 may include a single computer-readable statement or many computer-readable statements. The instructions 955 may be executable by the processor 967 to implement the methods that were described above in connection with the access terminals 122. Executing the instructions 955 may involve the use of the data 953 that is stored in the memory 951. FIG. 9 shows some instructions 955a and data 953a being loaded into the processor 967.

The wireless device/electronic device 922 may also include a transmitter 963 and a receiver 965 to allow transmission and reception of signals between the wireless device/electronic device 922 and a remote location. The transmitter 963 and receiver 965 may be collectively referred to as a transceiver 961. An antenna 926 may be electrically coupled to the transceiver 961. The wireless device/electronic device 922 may also include (not shown) multiple transmitters, multiple receivers, multiple transceivers and/or multiple antennas.

The various components of the wireless device/electronic device 922 may be coupled together by one or more buses, which may include a power bus, a control signal bus, a status signal bus, a data bus, etc. For simplicity, the various buses are illustrated in FIG. 9 as a bus system 957.

In the above description, reference numbers have sometimes been used in connection with various terms. Where a term is used in connection with a reference number, this may be meant to refer to a specific element that is shown in one or more of the Figures. Where a term is used without a reference number, this may be meant to refer generally to the term without limitation to any particular Figure.

It should be noted that the terms "couple," "coupling," "coupled" or other variations of the word couple as used herein may indicate either an indirect connection or a direct connection. For example, if a first component is "coupled" to a second component, the first component may be either indirectly connected (e.g., through one or more other components) to the second component or directly connected to the second component.

Additionally, it should be noted that as used herein, designating a component, element or entity (e.g., transistor, capacitor, resistor, power supply, circuit, filter, switch, block, module, etc.) as a "first," "second," "third" or "fourth" component, etc., may be used to distinguish components for explanatory clarity. It should also be noted that labels used to designate a "first," "second," "third" or "fourth," component etc., do not necessarily imply a particular order or that elements with lower value labels are included or used.

As used herein, the terms "circuit," "circuitry" and other variations of the term "circuit" may denote at least one structural element or component. For example, circuitry may include one or more elements or components such as resistors, capacitors, inductors, transistors, amplifiers, transformers, flip-flops, registers, etc. Additionally or alternatively, circuitry may be an aggregate of circuit components, such as integrated circuit components, in the form of processing and/or memory cells, units, blocks and/or other components.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The functions described herein may be stored as one or more instructions on a processor-readable or computer-readable medium. The term "computer-readable medium" refers to any available medium that can be accessed by a computer or processor. By way of example, and not limitation, such a medium may comprise RAM, ROM, EEPROM, flash memory, CD-ROM or other optical disk storage, magnetic disk storage or other magnetic storage devices, or any other medium that can be used to store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers. It should be noted that a computer-readable medium may be tangible and non-transitory. The term "computer-program product" refers to a computing device or processor in combination with code or instructions (e.g., a "program") that may be executed, processed or computed by the computing device or processor. As used herein, the term "code" may refer to software, instructions, code or data that is/are executable by a computing device or processor.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A current mirror circuit, comprising:
a first transistor and a second transistor, wherein gates of the first transistor and second transistor are coupled at a bias voltage;
a voltage offset circuit including at least one operational amplifier, wherein the at least one operational amplifier is arranged to reduce the bias voltage by an offset voltage; and
an auxiliary transistor that is biased into weak inversion by receiving the reduced bias voltage at a gate of the auxiliary transistor, wherein sources of the first transistor, second transistor and auxiliary transistor are coupled together, wherein a primary current from a drain of the second transistor combines with an auxiliary current from a drain of the auxiliary transistor to produce an output current, wherein the output current constitutes an output of a baseband filter.

2. The current mirror circuit of claim 1, wherein a third harmonic component of the primary current is approximately 180 degrees out of phase with a third harmonic component of the auxiliary current.

3. The current mirror circuit of claim 1, wherein a baseband component of the primary current is in phase with a baseband component of the auxiliary current.

4. The current mirror circuit of claim 1, wherein the at least one operational amplifier comprises a first operational amplifier with a gain of approximately two, wherein the second transistor has a gate length approximately double a gate length of the auxiliary transistor.

5. The current mirror circuit of claim 4, wherein an output of the voltage offset circuit is phase shifted by a second operational amplifier of the at least one operational amplifier, wherein the second operation amplifier is biased with a variable capacitor, wherein an output of the second operational amplifier is directed to the gate of the auxiliary transistor.

6. The current mirror circuit of claim 1, wherein the gates of the auxiliary transistor and the second transistor are coupled via a switch.

7. The current mirror circuit of claim 1, wherein the baseband filter is a baseband filter of a wireless transmitter that receives an analog transmit signal from a digital-to-analog converter and sends the output current to a mixer.

8. The current mirror circuit of claim 1, wherein the sources of the first transistor, second transistor and auxiliary transistor are directly coupled together.

9. The current mirror circuit of claim 1, wherein the primary current flows from the source of the second transistor to the drain of the second transistor, and wherein the auxiliary current flows from the source of the auxiliary transistor to the drain of the auxiliary transistor.

10. The current mirror circuit of claim 1, wherein the voltage offset circuit further comprises a resistor coupled to the at least one operational amplifier.

* * * * *